United States Patent [19]
Parkinson

[11] Patent Number: 5,210,450
[45] Date of Patent: May 11, 1993

[54] ACTIVE SELECTABLE DIGITAL DELAY CIRCUIT

[75] Inventor: Peter B. Parkinson, Tigard, Oreg.

[73] Assignee: Tektronix, Inc., Wilsonville, Oreg.

[21] Appl. No.: 906,019

[22] Filed: Jun. 29, 1992

Related U.S. Application Data

[63] Continuation of Ser. No. 846,984, Mar. 9, 1992, abandoned, which is a continuation of Ser. No. 742,185, Aug. 2, 1991, abandoned, which is a continuation of Ser. No. 509,273, Apr. 16, 1990, abandoned.

[51] Int. Cl.$^5$ .......................... H03K 5/13; H04J 3/04
[52] U.S. Cl. .................. 307/603; 307/355; 307/601; 307/602; 307/605; 307/280; 370/112
[58] Field of Search ............... 307/254, 242, 243, 355, 307/455, 590, 592, 595, 596, 597, 600, 603, 602, 601, 605, 269, 228, 261, 280, 300; 370/112; 328/35, 181, 185

[56] References Cited

U.S. PATENT DOCUMENTS

| | | | |
|---|---|---|---|
| 3,050,640 | 8/1962 | Dillingham et al. | 307/280 |
| 3,693,030 | 9/1967 | Walters | 307/600 |
| 3,862,406 | 1/1975 | Brooks | 307/595 |
| 4,016,511 | 4/1977 | Ramsey et al. | 307/603 |
| 4,266,204 | 5/1981 | Jacoby | 307/264 |
| 4,338,532 | 7/1982 | Houghton | 307/605 |
| 4,354,266 | 10/1982 | Cooperman et al. | 307/243 |
| 4,367,422 | 1/1983 | Leslie | 307/597 |
| 4,458,165 | 7/1984 | Jackson | 307/595 |
| 4,641,048 | 2/1987 | Pollock | 307/597 |
| 4,645,958 | 2/1987 | Suzuki et al. | 307/592 |
| 4,651,038 | 3/1987 | Cline et al. | 307/591 |
| 4,686,392 | 8/1987 | Lo | 307/448 |
| 4,698,657 | 10/1987 | Matsumoto | 307/475 |
| 4,710,654 | 12/1987 | Saitoh et al. | 307/601 |
| 4,797,585 | 1/1989 | Segawa et al. | 307/597 |
| 4,797,586 | 1/1989 | Traa | 307/603 |
| 4,820,944 | 4/1989 | Herlein et al. | 307/603 |
| 4,866,314 | 9/1989 | Traa | 307/603 |
| 4,885,484 | 12/1989 | Gray | 307/564 |
| 4,959,565 | 9/1990 | Knecht et al. | 307/596 |
| 4,963,767 | 10/1990 | Sinh | 307/243 |
| 5,043,610 | 8/1991 | Craddock | 307/597 |
| 5,050,167 | 9/1991 | Izadpanah | 370/112 |
| 5,140,199 | 8/1992 | Seo | 307/592 |

FOREIGN PATENT DOCUMENTS 0022436 2/1984 Japan .................. 307/603

OTHER PUBLICATIONS

Nilsson; "Electric Circuits"; 1983 pp. 186–188.
IEEE Standard Dictionary of Electrical and Electronic Terms; Jul. 20, 1984; p. 328.
Mattausch et al.; Journal of Solid-State Circuits, vol. 23, #1, Feb. 88.
Basiladze et al.; "A Pulse Former With Controlled Delay In The Nanosecond Range"; May 23, 1979.

*Primary Examiner*—William L. Sikes
*Assistant Examiner*—Terry D. Cunningham
*Attorney, Agent, or Firm*—Francis I. Gray

[57] ABSTRACT

An active selectable digital delay circuit merges delay elements within a multiplexer to reduce power consumption, area and minimum delay. A current switch forms a basic element of a multiplexer. A group of current switches form an input to the multiplexer and another group of current switches form a control input to the multiplexer, the current switches being in a hierarchical tree configuration. Each input current switch has a resistor between an input voltage and the input to the current switch, the value of the resistor determining the amount of propagation delay between the input and output of the input current switch. With each input having a different resistance value, each input current switch provides a different amount of propagation delay for the input signal so that the delay of the output signal is determined by which input of the multiplexer is selected for output. Multiplexers may be cascaded to extend the selectable delay range between the input and output signals, with each output being input to a plurality of input resistors at the subsequent multiplexer in the cascade.

2 Claims, 3 Drawing Sheets

ACTIVE SELECTABLE DIGITAL DELAY CIRCUIT

This is a continuation of application Ser. No. 07/846,984 filed Mar. 9, 1992 and now abandoned, which was a continuation of application Ser. No. 07/742,185 filed Aug. 2, 1991 and now abandoned, which was a continuation of application Ser. No. 07/509,273 filed Apr. 16, 1990 and now abandoned.

BACKGROUND OF THE INVENTION

The present invention relates to digital delay devices, and more particularly to an active selectable digital delay circuit that merges digital gates with a multiplexer.

Previous active selectable digital delay devices, such as that shown in U.S. Pat. No. 4,646,297 issued Feb. 24, 1987 to Steven R. Palmquist et al entitled "Skew Detector", especially FIG. 7, have used a plurality of delay elements connected in series with the output of each delay element being input to a multiplexer. Each delay element has a fixed delay time, and by selecting which delay element is output by the multiplexer a total delay of n*dt is achieved, where n is the number of delay elements in the series of delay elements selected by the multiplexer and dt is the delay time for each delay element. Since each delay element requires its own current source and the delay range is a function of the total number of delay elements, this requires a large number of devices with a corresponding relatively high power requirement.

What is desired is an active selectable digital delay circuit that merges the digital gates with the multiplexer to reduce power consumption, area and minimum delay.

SUMMARY OF THE INVENTION

Accordingly the present invention provides an active selectable digital delay circuit having a multiplexer formed by a tree of current switches. The current switches are divided into input current switches to which input voltages are applied and control current switches to which control voltages are applied. A current source provides current for the current switches selected by the control voltages to select the input voltage to be passed to the multiplexer output. Each multiplexer input has an input resistor, the value of which controls the delay through that input current switch by establishing the base-emitter capacitance charge rate. A plurality of these multiplexers may be cascaded together with appropriately chosen input resistances to establish a wide range of selectable digital delays.

The objects, advantages and other novel features of the present invention are apparent from the following detailed description when read in conjunction with the appended claims and attached drawing.

DESCRIPTION OF THE PREFERRED EMBODIMENT

Figure 1:
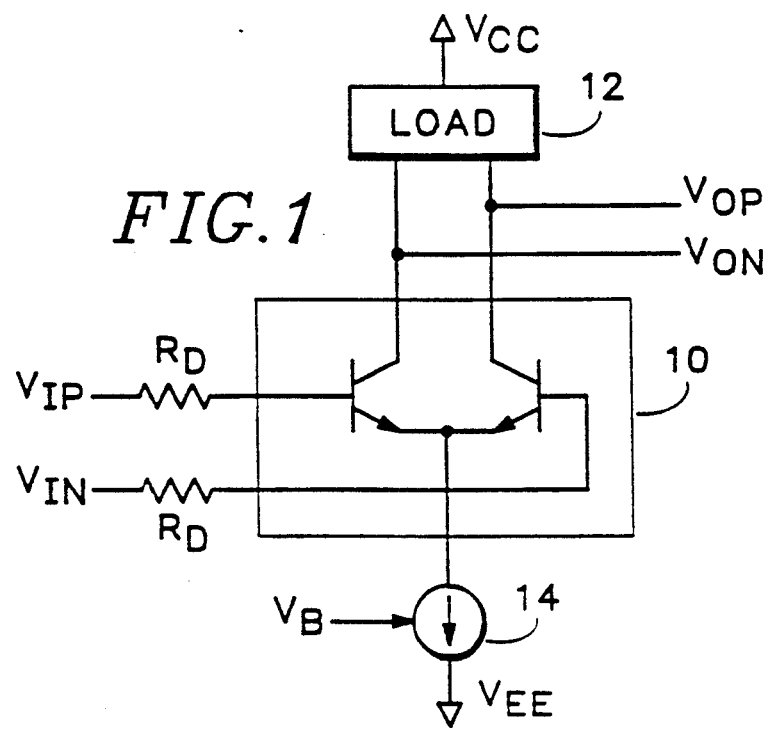
FIG. 1 is a basic block diagram of a delay element for an active selectable digital delay circuit according to the present invention.
Figure 2:
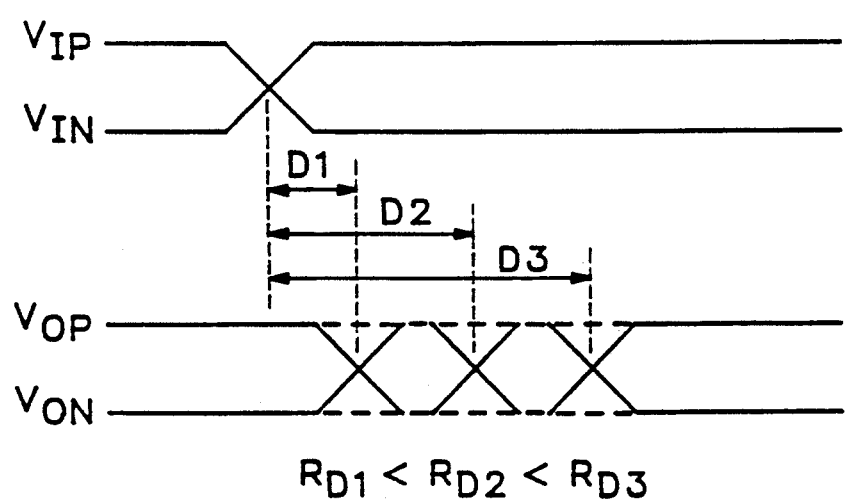
FIG. 2 is a timing diagram to illustrate the operation of the delay element of FIG. 1.

Referring now to FIG. 1 a current switch 10 is shown having a differential pair of input voltages Vip, Vin. A load 12 is applied to the output of the current switch 10, from which a differential pair of output voltages Vop, Von is taken, and a current source 14 drives the current switch. At the inputs of the current switch 10 are a pair of resistors Rd that couple the input voltages Vip, Vin to the current switch. As shown in FIG. 2 before a transition of the input voltages one transistor of the current switch 10 is cut off while the other one conducts, the current being supplied by the current source 14. When the input voltages transition there is a finite time before the transistors of the current switch 10 switch states from conducting to cut off and vice versa. This finite time is a function of the base to emitter capacitance of the transistors. Therefore with no resistors at the inputs, Rd=0, there is still a small delay D1 between the time the input voltages transition and the transition appears in the output voltages. By adding resistance into the inputs the base current is decreased and the charge time of the base to emitter capacitance is increased, increasing the delay D2, D3 of the transition through the current switch 10.

Although the embodiment shown uses a resistor to change the base current, and thus the charge time of the base to emitter capacitance, other means for varying the base current may be used. For example the resistors may be replaced with emitter follower configured transistors having a variable current source coupled to the emitters, the emitters also being coupled to the bases of the current switch transistors. Variation of the current source varies the base current to the current switch transistors, thus varying the base to emitter capacitance charge time and the corresponding delay.

Figure 3:
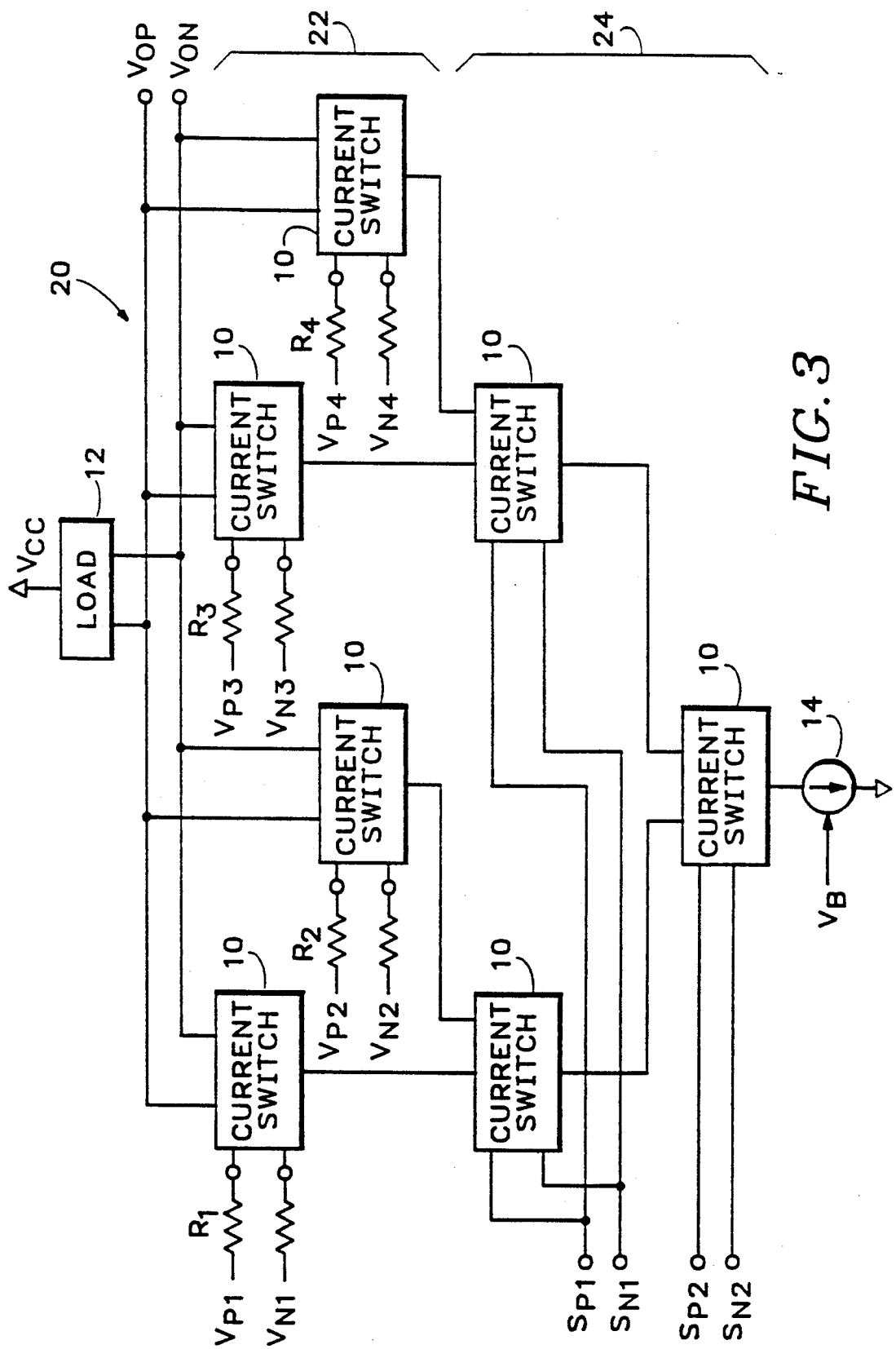
FIG. 3 is a block diagram of a multiplexer element for an active selectable digital delay circuit according to the present invention.

A multiplexer 20 is shown in FIG. 3 that is formed of a plurality of current switches 10 in a tree configuration. Input signal pairs Vp1,Vn1; Vp2,Vn2; Vp3,Vn3; Vp4,Vn4 are applied as inputs to four separate input current switches 22 via different resistor pairs R1, R2, R3, R4, each resistor pair having a value greater than the preceding resistor pair, i.e., R1<R2<R3<R4. A differential control signal Sp1,Sn1; Sp2,Sn2 is applied to a plurality of three separate control current switches 24 so that the current from the current source 14 is routed through the current switches 10 to select the input signal at one of the input terminals Vp1,Vn1; Vp2,Vn2; Vp3,Vn3; Vp4,Vn4 to be passed through as the output signal Vop, Von delayed by an amount determined by the appropriate input resistance Rd. As described a 4:1 multiplexer is formed with the delay elements being merged into the multiplexer.

Figure 4:
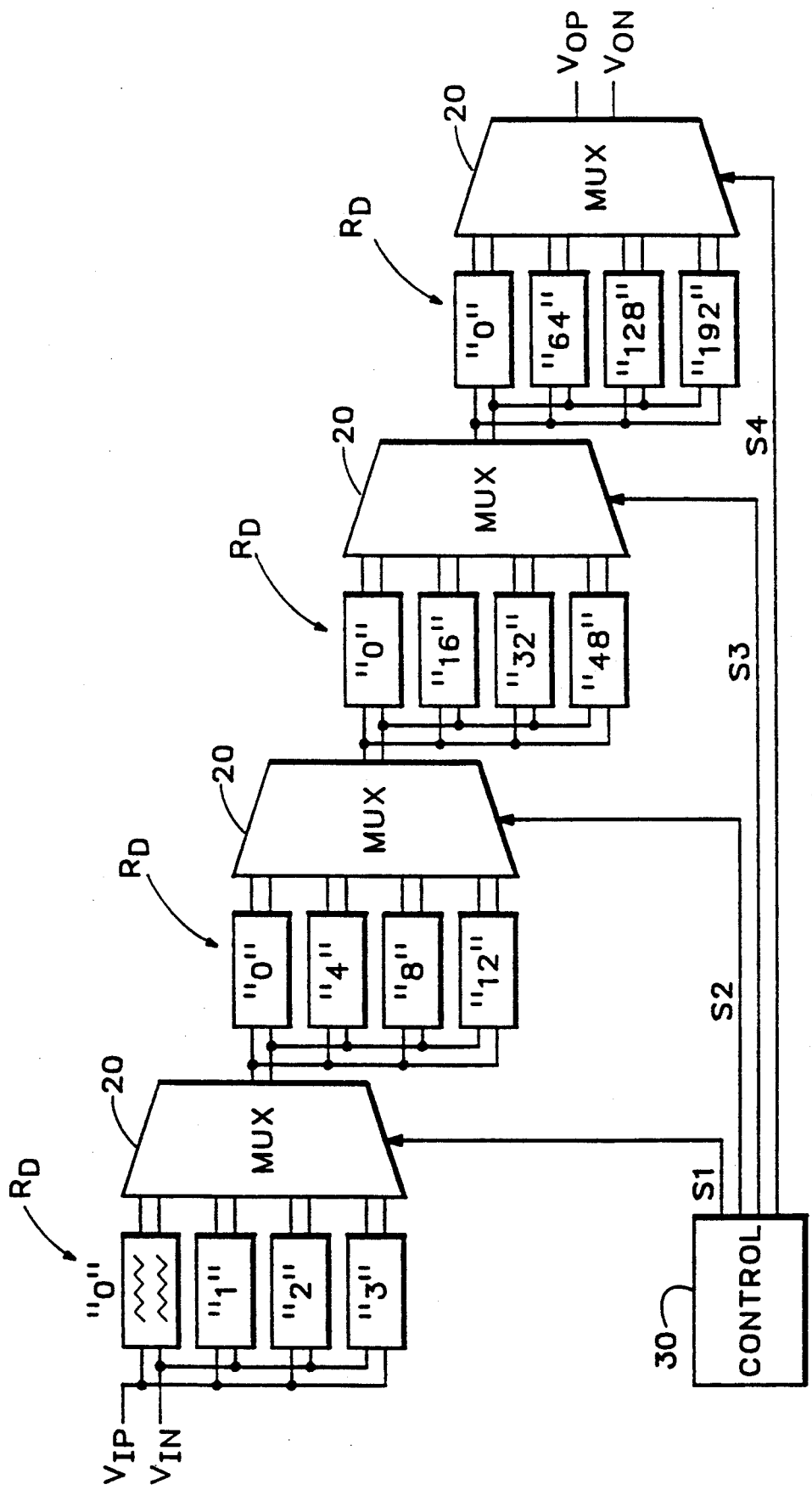
FIG. 4 is a block diagram of an active selectable digital delay circuit according to the present invention using the multiplexer elements of FIG. 3.

To provide a wider range of delays a plurality of the multiplexers 20 may be cascaded together as shown in FIG. 4. The input voltages Vip, Vin are applied to four sets of input resistors Rd simultaneously. "0" represents the minimum delay path where Rd may be zero, and "1", "2" and "3" represent the respective units of delay, i.e., if a minimum unit of delay is one picosecond, then "1" represents a one picosecond delay over "0", "2" represents a two picosecond delay over "0", etc. The particular delay output from the first multiplexer is determined by a first control signal S1 output by a controller 30. In like manner the output of the first multiplexer is input to four more sets of resistors representing delay units of "0", "4", "8" and "12". The outputs of these sets of resistors are input to a second multiplexer controlled by a second control signal S2. Thus if a signal is selected from "3" by the first multiplexer and from "8" by the second multiplexer, the total delay at the output of the second multiplexer is 11 units. The cascade may be continued in like manner with additional multiplexers fed by the output of the prior multiplexer through respective sets of resistors until the desired delay range is achieved. The output of the last multiplexer 20 is the delayed output voltage pair Vop, Von.

Power consumption is reduced by eliminating the current source required for each delay element or digital gate, area of an integrated circuit implementation is saved by eliminating the majority of circuit elements required to implement each digital gate, and the minimum delay time is reduced by eliminating the propagation delays of the series of digital gates preceding the multiplexer.

Thus the present invention provides an active selectable digital delay circuit that merges delay elements into the multiplexer by using current switches with input resistors to control the amount of delay from each switch.

What is claimed is:

1. A multiplexer for an active selectable digital delay circuit comprising:

a plurality of current switches separated into a group of input current switches and a group of control current switches, each input current switch having a differential input for receiving a differential pair of input voltage signals, a differential output for providing a differential pair of output voltage signals and a control input coupled to one of the control current switches, the differential outputs being coupled together to form a single differential output, each input current switch having a charge delay characteristic at the differential input, and each control current switch having an input for receiving a control signal, wherein the control current switches are coupled to each other in a tree configuration so that a differential pair of output voltage signals from one of the input current switches as determined by the control signal received by the control current switches is selected as a delayed voltage signal at the single differential output; and resistors coupled between each differential pair of input voltage signals and the respective differential inputs of the input current switches for determining a unique propagation delay interval for each input current switch so that the propagation delay interval between the input and output voltage signals for each input current switch is different.

2. An active selectable digital delay circuit comprising:

a plurality of multiplexers coupled in cascade, each multiplexer having a plurality of inputs and an output, the output of each multiplexer except the last multiplexer in the cascade being input to a plurality of resistors coupled between the output and the respective inputs of a subsequent multiplexer with an input signal being applied to a plurality of resistors coupled to the inputs of the first multiplexer of the cascade, each resistor providing a different current value for each input of each multiplexer, and with a delayed signal being obtained from the output of the last multiplexer, a propagation delay between the input signal and the delayed signal being determined by a signal path between the input signal and the delayed signal; and means coupled to the multiplexers for controlling which input to each multiplexer is coupled to the output of that multiplexer to define the signal path.

* * * * *